United States Patent [19]

Kermani et al.

[11] Patent Number: 5,002,630
[45] Date of Patent: Mar. 26, 1991

[54] METHOD FOR HIGH TEMPERATURE THERMAL PROCESSING WITH REDUCED CONVECTIVE HEAT LOSS

[75] Inventors: Ahmad Kermani, Fremont; Mike F. Robertson, San Jose; Yen-Hui Ku, Sunnyvale; Fred Wong, Fremont, all of Calif.

[73] Assignee: Rapro Technology, Fremont, Calif.

[21] Appl. No.: 361,986

[22] Filed: Jun. 6, 1989

[51] Int. Cl.[5] .............................................. C30B 25/14
[52] U.S. Cl. .................................... 156/610; 156/612; 156/613; 156/614; 156/DIG. 70; 427/255.1
[58] Field of Search ............... 156/610, 612, 613, 614, 156/DIG. 70; 427/255.1, 255.2, 255.5; 422/245, 246, 247

[56] References Cited

U.S. PATENT DOCUMENTS

| | | | |
|---|---|---|---|
| 4,714,594 | 12/1987 | Mircea | 156/610 |
| 4,782,034 | 11/1988 | Dentai et al. | 156/613 |
| 4,800,105 | 1/1989 | Nakayama et al. | 427/255.1 |
| 4,800,173 | 1/1989 | Kanai et al. | 156/613 |
| 4,839,312 | 6/1989 | Ovshinsky et al. | 427/255.1 |

OTHER PUBLICATIONS

Bachem, K. H., "Deposition Process for $Al_xGa_{1-x}As$", IBM Technical Disclosure Bulletin, vol. 19, No. 3, Aug., 1976, p. 1118.
Baliga, Epitaxial Silicon Technology, Academic Press, Inc. (1986), p. 23.
Bryant, W. A., "Review–The Fundamentals of Chemical Vapour Deposition", Journal of Materials Science 12 (1977), pp. 1285–1306.

Primary Examiner—Olik Chaudhuri
Assistant Examiner—Robert M. Kunemund
Attorney, Agent, or Firm—Fliesler, Dubb, Meyer & Lovejoy

[57] ABSTRACT

A method for inducing a reaction in a reaction chamber of a reactive carrier having a first specific heat, on a reaction surface of a substrate. The method comprises the steps of supporting the substrate in the reaction chamber. Next, the substrate is heated to a reaction temperature, so that the reaction surface has an essentially balanced temperature distribution. The reactive carrier is mixed with an inert gas having a second specific heat to form a reaction mixture, wherein the second specific heat is lower than the first specific heat. Finally, the reaction mixture is supplied into the chamber so that it flows over the surface of the substrate. Because the inert gas has a lower specific heat than the carrier, the overall specific heat of the reaction mixture is reduced. With a lower specific heat, less heat is transferred from the wafer into the reaction mixture. This reduces convective heat loss and thermal gradients in the substrate. The technique is particularly applicable to rapid thermal processing of semiconductor wafers for epitaxial growth of silicon. According to this aspect, hydrogen is the reactive carrier, mixed with a chlorinated silicon source. The inert gas may be argon.

13 Claims, 2 Drawing Sheets

METHOD FOR HIGH TEMPERATURE THERMAL PROCESSING WITH REDUCED CONVECTIVE HEAT LOSS

FIELD OF THE INVENTION

The present invention relates to high temperature thermal processing, such as is used in rapid thermal chemical vapor deposition, requiring a balanced distribution of heat across a reaction surface on a substrate.

BACKGROUND OF THE INVENTION

Rapid thermal processing of semiconductor wafers involves placement of a semiconductor wafer in a reaction chamber which is thermally isolated from the wafer. The wafer is rapidly heated to a reaction temperature, with a reactant gas flowing over the wafer to induce reaction at the heated surface of the wafer. The wafer is then cooled and removed from the chamber and transported to further processing.

In rapid thermal processing, it is very difficult to ensure that the temperature distribution across the reaction surface of the wafer is dynamically uniform. Non-uniformities in the temperature distribution result in dislocations when growing single crystal layers, or other non-uniformities in the process occurring at the reaction surface.

Accordingly, technology has evolved to provide for a reasonably uniform temperature distribution across the reaction surface, taking into account radiant and convective heat losses. However, when flowing a reactant gas across a thermally isolated semiconductor wafer, convective heat loss tends to aggravate the uneven distribution of temperature. In particular, the convective heat loss around the edges of the wafer is greater than that in the center.

Dislocations in the semiconductor wafer are formed due to radial temperature gradients from the edge to the center of the semiconductor wafer. If the magnitude of tensile stress induced by the temperature gradients exceeds the yield stress of the semiconductor wafer material at the reaction temperature, plastic deformation of the growing layer and the substrate occurs. This plastic deformation results in dislocations or slip lines in the substrate and the grown layers.

Accordingly, it is desirable to have a method for rapid thermal processing of a substrate which reduces the thermal gradients in the substrate induced by convective heat loss.

SUMMARY OF THE INVENTION

The present invention is a method for inducing a reaction of reactant gases including a reactive carrier having a first specific heat, on a reaction surface of a substrate. The method comprises the steps of supporting the substrate in a reaction chamber. Next, the substrate is heated to a reaction temperature, so that the reaction surface has an essentially balanced temperature distribution. The reactive carrier is mixed with an inert gas having a second specific heat to form a reaction mixture, wherein the second specific heat is lower than the first specific heat. Finally, the reaction mixture is supplied into the chamber so that it flows against the surface of the substrate.

Because the inert gas has a lower specific heat than the reactive carrier, the overall specific heat of the reaction mixture is reduced. With a lower specific heat, less heat is transferred by convection from the wafer into the reaction mixture. This reduces thermal gradients in the substrate.

The present invention is particularly applicable to rapid thermal processing of semiconductor wafers for epitaxial growth of silicon. According to this aspect, the reactant gases include a chlorinated silicon source (e.g., $Si_xH_yCl_z$) mixed with hydrogen, as the reactive carrier. The inert gas may be argon, neon, xenon or krypton. A concentration of hydrogen is maintained high enough to ensure a reasonable deposition rate at the surface. One example is disclosed in which about 90% argon by volume is provided in the reaction mixture.

According to the present invention, much higher quality epitaxial layers of silicon have been grown in a cold wall reaction chamber using rapid thermal chemical vapor deposition technology.

DETAILED DESCRIPTION

Figure 1:
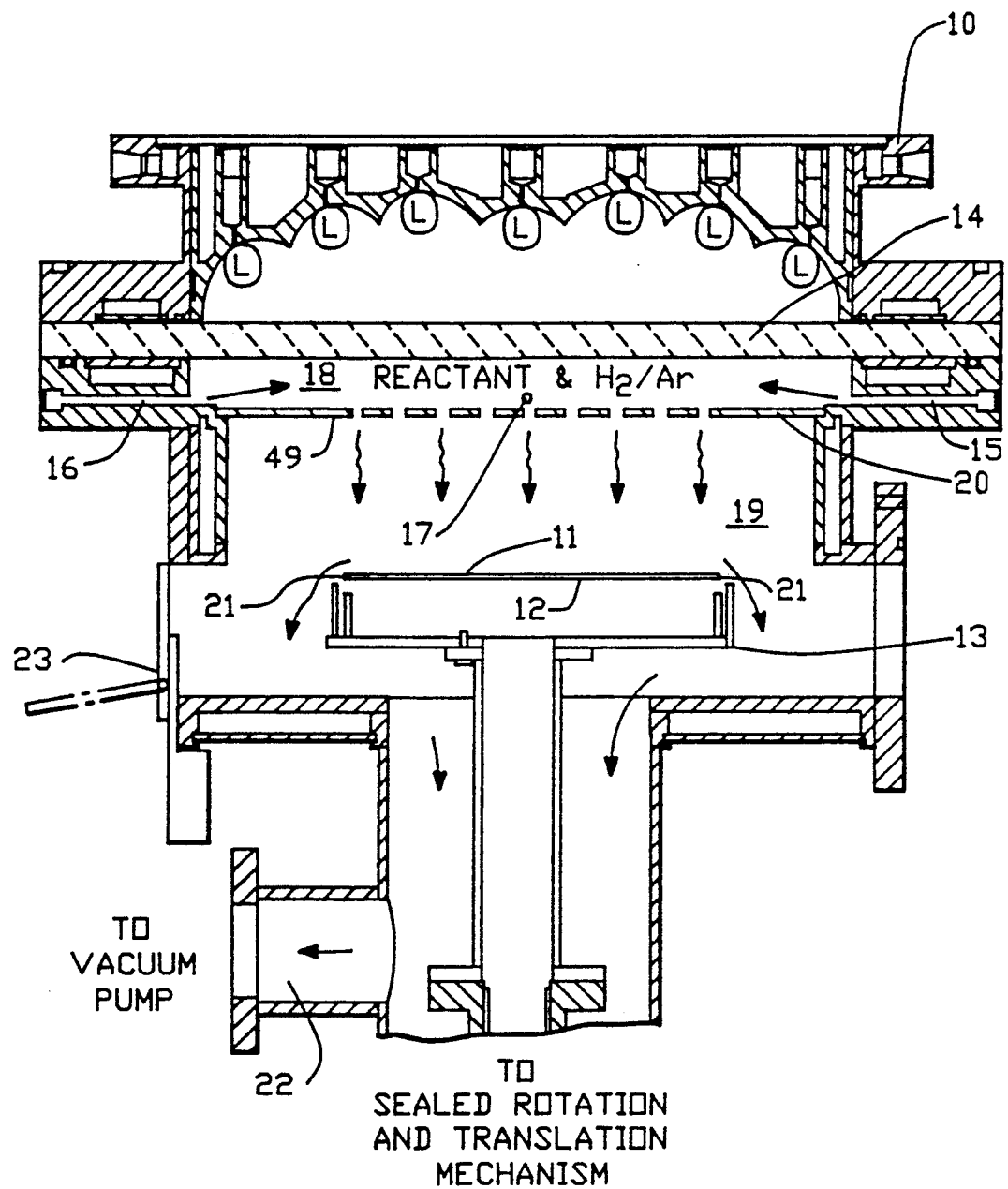
FIG. 1 is a cross-sectional view of a cold wall reaction chamber suitable for practicing the present invention.
Figure 2:
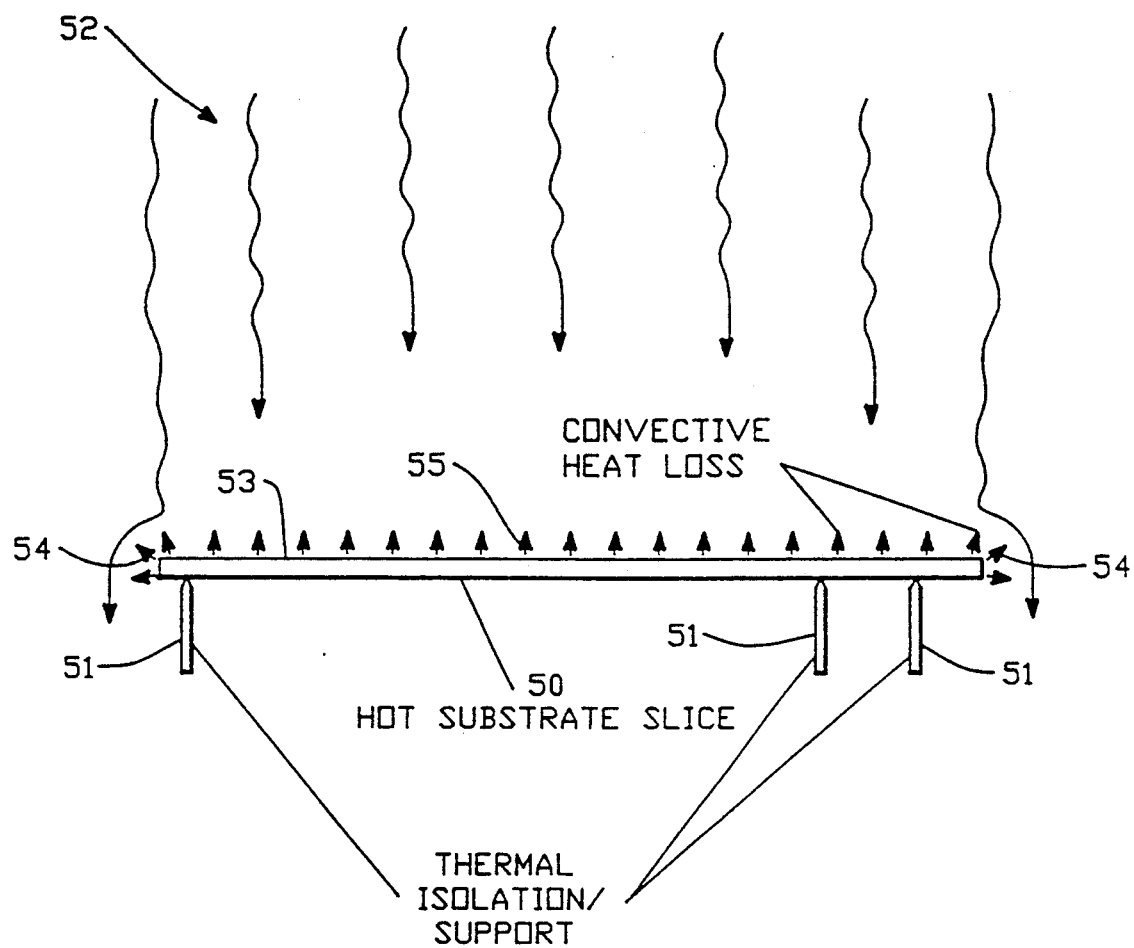
FIG. 2 is a schematic diagram illustrating the gas flow dynamics and convective heat loss in the reaction chamber of FIG. 1, or in similar reaction chambers.

With reference to FIGS. 1 and 2, a preferred embodiment of the present invention is described.

FIG. 1 illustrates a reaction chamber suitable for carrying out the present invention. A detailed specification of the reaction chamber as shown in FIG. 1 is set out in co-pending U.S. patent application entitled REACTION CHAMBER WITH CONTROLLED RADIANT ENERGY HEATING AND DISTRIBUTED REACTANT FLOW, filed May 15, 1989, Ser. No. 07/351,829, invented by Wong et al., which is owned by and was owned at the time of invention by the same Assignee as the present application, and which is incorporated by reference.

The reaction chamber as shown in FIG. 1 is a cold wall reaction chamber with radiant heating of the semiconductor wafer in the chamber. The chamber includes a lamp head 10 which supports a radiant heat source, e.g., a plurality of lamps L in an array that provides a controlled distribution of radiant energy at a reaction surface 11 on a semiconductor wafer 12. The semiconductor wafer 12 is supported by a support mechanism 13 which thermally isolates the wafer from the walls of the chamber. A quartz window 14 seals the chamber, while allowing the radiant energy to enter the chamber and heat the wafer 12. The reaction mixture is supplied through ports 15, 16, and 17 into a chamber 18 which acts as a plenum for the reactant and carrier gases. The chamber 18 is separated from a main chamber 19 by a perforated quartz window 20. The reactant with a carrier gas enters the main chamber 19 through the perforations in the window 20. The mixture flows downward onto the reaction surface 11 around the edges 21 of the semiconductor wafer and down through flange 22 to a vacuum pump. The support member 13 is coupled to a sealed rotation and translation mechanism (not shown).

The chamber includes an access port 23 which allows for insertion and removal of the semiconductor wafers.

FIG. 2 illustrates the gas flow dynamics around the semiconductor wafer.

In FIG. 2, a hot substrate slice 50 is supported on thermal isolation/support pins 51. The carrier gas and reactant gas flow downward as indicated by arrows 52 onto the reaction surface 53 of the substrate slice 50. Vectors emanating from the hot slice 50 indicate convective heat loss on the hot substrate slice 50. It can be seen that the convective heat loss vectors 54 near the edges of the slice 50 are much greater than the vectors 55 near the center of the wafer. This differential in convective heat loss causes thermal gradients across the slice which can result in non-uniformities of the process occurring at the surface 53 of the slice 50.

According to the present invention, a reactant and reactive carrier having a high specific heat is combined with a low specific heat inert gas, such as argon, during a high temperature thermal process in order to reduce the specific heat of the reaction mixture. With a reduced specific heat, convective cooling due to flow of the reaction mixture over the substrate slice is decreased.

The overall pressure and flow rates of the gas mixture are dictated by a variety of process parameters. For instance, the reactive carrier/inert gas mixture must have sufficient mass to cause a uniform distribution of reactant in the chamber, especially near the boundary layer on the surface of the substrate, to ensure uniform film growth. Also, for mass transfer limited reactions, the flow must be sufficient to minimize the boundary layer thickness.

The amount of reactive carrier mixed with the inert low specific heat gas, in relationship to the deposition rate and the effectiveness of the defect reduction is dictated by the requirements of the particular process and process chamber. For example, some chemical reactions require a higher percentage of reactive carrier to occur, some need less.

This technique has been applied specifically to rapid thermal chemical vapor deposition, RTCVD, of single-crystal silicon films by substituting, for a given pressure and flow rate, a gas mixture of argon and hydrogen for pure hydrogen as the pre-bake ambient gas and the carrier gas.

The RTCVD of single-crystal silicon films on a silicon wafer is accomplished by using dichlorosilane as the source of silicon carried by hydrogen. According to the present invention, the hydrogen is mixed with argon or another inert gas, like neon, krypton, or xenon. Krypton and xenon have lower specific heats than argon, and may be preferred in some reactions requiring high concentrations of reactive carrier. The process is carried out at temperatures of the silicon substrate above 750 degrees C. under atmospheric or reduced pressure. The single-crystal silicon layer can be in-situ doped N-type or P-type to provide the required resistivity for the fabrication of integrated circuits in MOS, bipolar, or Bi-CMOS technologies.

The dichlorosilane gas can be replaced with other chlorinated silicon sources, such as the chlorinated silanes $Si_xH_yCl_z$, where y may be zero, or mixtures of the same. However, the dichlorosilane reaction is the preferred reaction for the present invention.

A simplified version of the thermal-chemical reaction is given below:

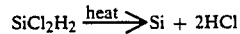

$$SiCl_2H_2 \xrightarrow{heat} Si + 2HCl$$

In this reaction, the dichlorosilane gas decomposes when heated at the boundary layer on the substrate surface to $SiCl_2$ and $H_2$. The $SiCl_2$ diffuses to the surface, then reacts with $H_2$ to form the HCl and silicon. The HCl is desorbed through the boundary layer into the chamber and carried away.

A hydrogen gas carrier is used to improve the deposition rate by supplying sufficient hydrogen concentration to fuel the decomposition $SiCl_2$ to Si and HCl. See, Baliga, EPITAXIAL SILICON TECHNOLOGY, Academic Press, Inc. (1986), p. 23. Thus, hydrogen is involved in the CVD reaction and is a "reactive carrier".

Using the following specific process conditions, a great reduction in defect density has been verified.
Pre-bake ambient: 10% hydrogen in argon by volume.
Pre-bake temperature: 1050° for 5 seconds, 1000° for 20 seconds.
Pressure: 50 torr.
Deposition temperature: 1000° C.
Reaction mixture: argon/hydrogen gas, 10% hydrogen in argon by volume at 18 slpm, with dichlorosilane flow at 90 sccm.

At temperatures above about 950° C., this reaction is, at least in part, mass transfer limited. So the flow rate and concentrations of the reaction mixture are selected to establish a thin, uniform boundary layer.

The reduction in the defect density was verified by visual inspection, Nomarski Optical Microscopy, and decorative etched techniques. The thickness and quality of the single-crystal silicon films were verified by Fourier Transform infrared spectroscopy FTIR for thickness measurement, spreading resistance profile technique SRP for the resistivity measurements and channelling Rutherford backscattering spectroscopy RBS for structural quality of the single-crystalline films. The results indicate that (1) the deposited film is single crystal silicon with very high degree of crystal quality; (2) the use of the argon/hydrogen gas mixture is effective to reduce the density of defects.

Although the specific example providing for RTCVD of single-crystal silicon films on silicon wafers using the hydrogenated-chlorinated silicon source has been disclosed, the invention can be applied to any thermal process in which a high specific heat reactive carrier is flowed over a heated substrate, and in which the reactive carrier can be mixed with a low specific heat inert gas to reduce the convective cooling of the substrate material.

Further, the invention can be applied to both inert processes, like the pre-bake step referred to above, where hydrogen is used to catalyze decomposition of $SiO_x$ on the reaction surface to volatile SiO, or thermal annealing processes, and to reactive processes, like epitaxial silicon film deposition.

Another inert process using hydrogen as a "reactive" carrier is used in gallium arsenide processing. When a substrate GaAs is heated, As tends to diffuse out of the solid substrate, so an overpressure of arsene $AsH_3$ in a carrier of $H_2$ gas is flowed against the substrate in high temperature processes to reduce the out-diffusion. The $H_2$ carrier is used to prevent decomposition of the $AsH_3$ and is thus a "reactive" carrier. The present invention could be applied to this inert process to reduce convective heat loss at the substrate.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. A method for inducing formation of a layer of silicon on a reaction surface of a substrate, comprising the steps of:
   thermally isolating the substrate in a reaction chamber;
   heating the substrate to a reaction temperature, so that the reaction surface has an essentially balanced temperature distribution; and
   flowing a mixture of a silicon source, a reactive carrier gas and an inert gas against the reaction surface, wherein the inert gas has a specific heat less than the reactive carrier to limit convective heat loss on the substrate.

2. The method of claim 1, wherein the substrate comprises a slice of mono-crystalline silicon.

3. The method of claim 1, wherein the layer formed is single-crystal silicon.

4. The method of claim 1, wherein the inert gas is argon.

5. The method of claim 1, wherein the silicon source comprises $Si_xH_yCl_z$, and the reactive carrier comprises hydrogen gas.

6. A method for inducing formation of an epitaxial layer of silicon on a reaction surface of a silicon substrate, comprising the steps of:
   thermally isolating the substrate in a cold wall reaction chamber;
   rapidly heating the substrate to a reaction temperature, so that the reaction surface has an essentially balanced temperature distribution; and
   flowing a mixture of a chlorinated silicon source, hydrogen gas and an inert gas into the reaction chamber against the reaction surface, wherein the inert gas has a specific heat less than hydrogen has to limit convective heat loss on the substrate.

7. The method of claim 6, wherein the inert gas is argon.

8. The method of claim 6, wherein the silicon source is dichlorosilane.

9. A method for inducing a mass transfer limited reaction in a reaction chamber of a reactant with a reactive carrier having a first specific heat, on a reaction surface of a substrate, comprising the steps of:
   thermally isolating the substrate in the reaction chamber;
   heating the substrate to a reaction temperature, so that the reaction surface has an essentially balanced temperature distribution;
   mixing the reactive carrier with an inert gas having a second specific heat to form a reaction mixture, wherein the second specific heat is lower than the first specific heat, to limit capacity of the reaction mixture to cause convective heat loss; and
   flowing the reaction mixture and the reactant into the chamber to establish a boundary layer comprising the reactive carrier and the reactant on the surface of the substrate.

10. The method of claim 9, wherein the boundary layer has an essentially uniform concentration of reactant.

11. The method of claim 9, wherein the reactant consists of a chlorinated silicon source, the reactive carrier consists of hydrogen gas, and the reaction temperature is greater than 950 degrees Centigrade.

12. The method of claim 11, wherein the chlorinated silicon source comprises dichlorosilane.

13. The method of claim 9, wherein the inert gas comprises one or more of the group including neon, argon, xenon, and krypton.

* * * * *